United States Patent
Zhu et al.

(10) Patent No.: US 11,960,051 B2
(45) Date of Patent: Apr. 16, 2024

(54) META-LENS STRUCTURE AND METHOD OF FABRICATING THE SAME

(71) Applicant: Agency for Science, Technology and Research, Singapore (SG)

(72) Inventors: Shiyang Zhu, Singapore (SG); Chih-Kuo Tseng, Singapore (SG); Ting Hu, Singapore (SG); Zhengji Xu, Singapore (SG); Yuan Dong, Singapore (SG); Alex Yuandong Gu, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 405 days.

(21) Appl. No.: 17/292,124

(22) PCT Filed: Oct. 14, 2019

(86) PCT No.: PCT/SG2019/050510
§ 371 (c)(1),
(2) Date: May 7, 2021

(87) PCT Pub. No.: WO2020/101568
PCT Pub. Date: May 22, 2020

(65) Prior Publication Data
US 2021/0396910 A1    Dec. 23, 2021

(30) Foreign Application Priority Data

Nov. 15, 2018 (SG) .............................. 10201810181P (51) Int. Cl.
*G02B 1/00* (2006.01)
*G02B 1/02* (2006.01)

(52) U.S. Cl.
CPC ............... *G02B 1/002* (2013.01); *G02B 1/02* (2013.01)

(58) Field of Classification Search
None
See application file for complete search history.

(56) References Cited

U.S. PATENT DOCUMENTS

2010/0296165 A1* 11/2010 Tan .......................... G02B 6/43
359/583

FOREIGN PATENT DOCUMENTS

WO    2017091738 A1    6/2017
WO    2017176921 A1    10/2017

OTHER PUBLICATIONS

International Search Report for International Application No. PCT/SG2019/050510 dated Dec. 17, 2019, pp. 1-4.
(Continued)

*Primary Examiner* — Roberts P Culbert
(74) *Attorney, Agent, or Firm* — Shackelford, Bowen, McKinley & Norton, LLP (57) ABSTRACT

Various embodiments may provide a method of fabricating a meta-lens structure. The method may include forming a first dielectric layer in contact with a silicon wafer. The method may also include forming a second dielectric layer in contact with the first dielectric layer. A refractive index of the second dielectric layer may be different from a refractive index of the first dielectric layer. The method may further include, in patterning the second dielectric layer. The method may additionally include removing at least a portion of the silicon wafer to expose the first dielectric layer.

18 Claims, 10 Drawing Sheets

(56) References Cited

OTHER PUBLICATIONS

Written Opinion of the International Searching Authority for International Application No. PCT/SG2019/050510 dated Dec. 17, 2019, pp. 1-4.
Arbabi et al., "MEMS-Tunable Dielectric Metasurface Lens," Nature Communications, vol. 9, 2018, pp. 1-9.
She et al., "Adaptive Metalenses with Simultaneous Electrical Control of Focal Length, Astigmatism, and Shift," Science Advances, vol. 4, No. 2, Feb. 23, 2018, pp. 1-7.
Hu et al., "Demonstration of Color Display Metasurfaces via Immersion Lithography on a 12-inch Silicon Wafer," Optics Express, vol. 26, No. 15, Jul. 18, 2018, pp. 19548-19554.
Khorasaninejad et al., "Metalenses: Versatile Multifunctional Photonic Components," Science, vol. 358, 2017, p. 1146.
West et al., "All-Dielectdric Subwavelength Metasurface Focusing Lens," Optics Express, vol. 22, No. 21, Oct. 20, 2014, pp. 26212-26221.
She et al., "Large Area Metalenses: Design, Characterization, and Mass Manufacturing," Optics Express, vol. 26, No. 2, Jan. 22, 2018, pp. 1573-1585.
Zhou et al., "Efficient Silicon Metasurfaces for Visible Light," ACS Photonics, vol. 4, No. 3, 2017, pp. 544-551.
Fan et al., "Silicon Nitride Metalenses for Unpolarized High-NA Visible Imaging," Conference on Lasers and Electro-Optics, 2018, pp. 1-16.

* cited by examiner

META-LENS STRUCTURE AND METHOD OF FABRICATING THE SAME

CROSS-REFERENCE TO RELATED APPLICATION

This application claims the benefit of priority of Singapore application No. 10201810181P filed Nov. 15, 2018, the contents of it being hereby incorporated by reference in its entirety for all purposes.

TECHNICAL FIELD

Various aspects of this disclosure relate to a meta-lens structure. Various aspects of this disclose relate to a method of fabricating or forming a meta-lens structure.

BACKGROUND

Conventional lenses are made in the bulk form by shaping transparent materials, such as glass. Recently, metalenses have shown great potential in replacing conventional bulky optical components. Metalenses may be formed by arranging an array of diffractive optical elements (DOE) on a transparent substrate. Metalenses may allow modulation on amplitude, phase, and/or polarization pixel-by-pixel in sub-wavelength scale in the DOE array.

Figure 1A:
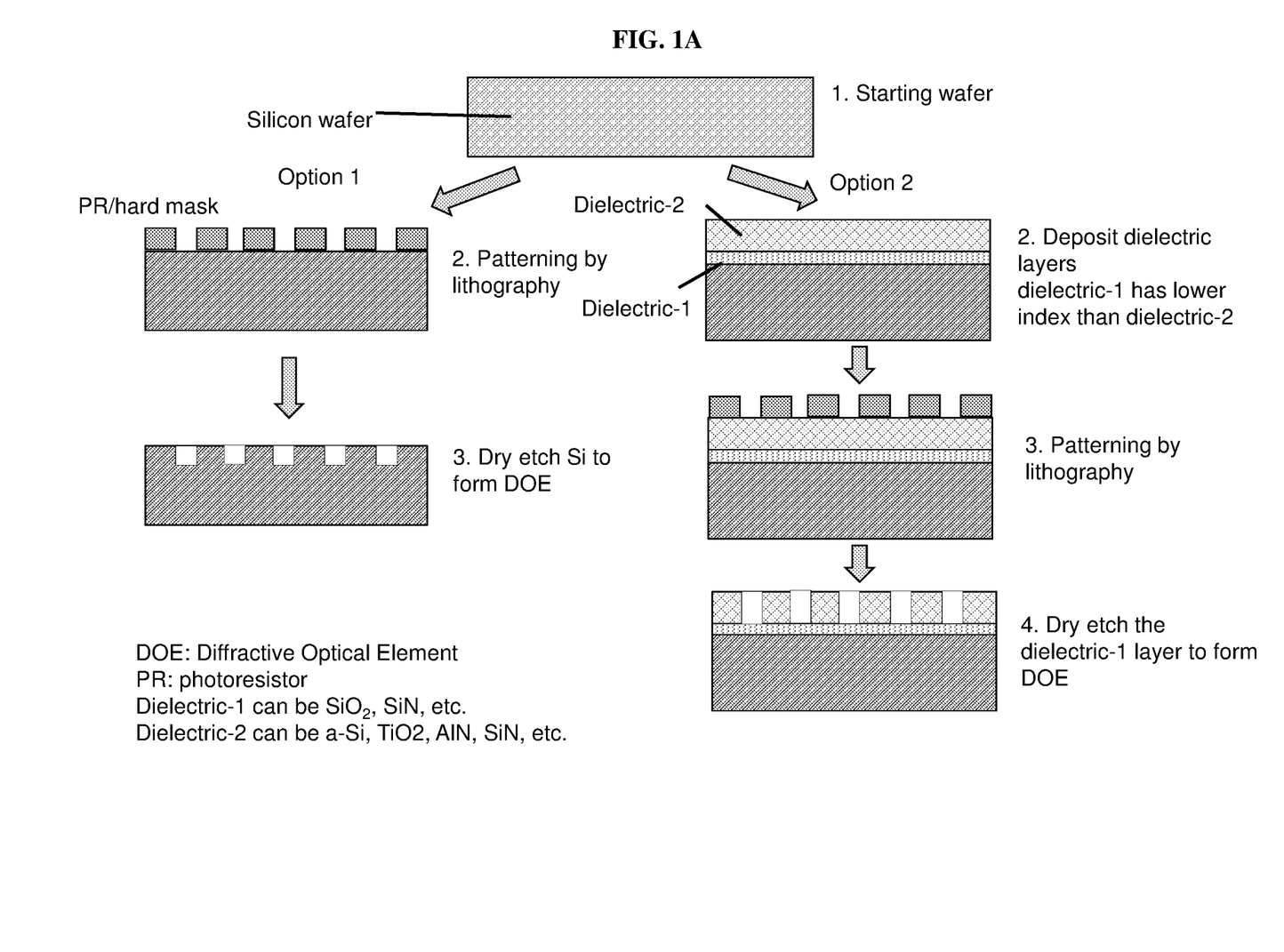
FIG. 1A shows a conventional process flow for fabricating infrared wavelengths metalenses on silicon substrates.

For metalenses operating at near infrared wavelengths around 1550 nm, silicon is transparent and can be used as substrates. As such, they can be fabricated using the standard semiconductor manufacturing technology. FIG. 1A shows a conventional process flow for fabricating infrared wavelengths metalenses on silicon substrates. As shown in FIG. 1A, for metalenses operating at near infrared wavelengths, a silicon wafer can be used as substrate. The DOE layer can be formed by directly silicon (Si) etch (option-1), or by etching a dielectric layer deposited on Si (option-2). FIG. 1A shows the schematic fabrication flow of these two options. For the option-2, the dielectric-2 should have a larger refractive index than the dielectric-1. The dielectric-1 may be silicon oxide ($SiO_2$), silicon nitride (SiN), or silicon oxynitride (SiON), whereas dielectric-2 can be amorphous silicon (a-Si), titanium oxide ($TiO_2$), aluminum nitride (AlN), silicon nitride (SiN) etc.

Figure 1B:
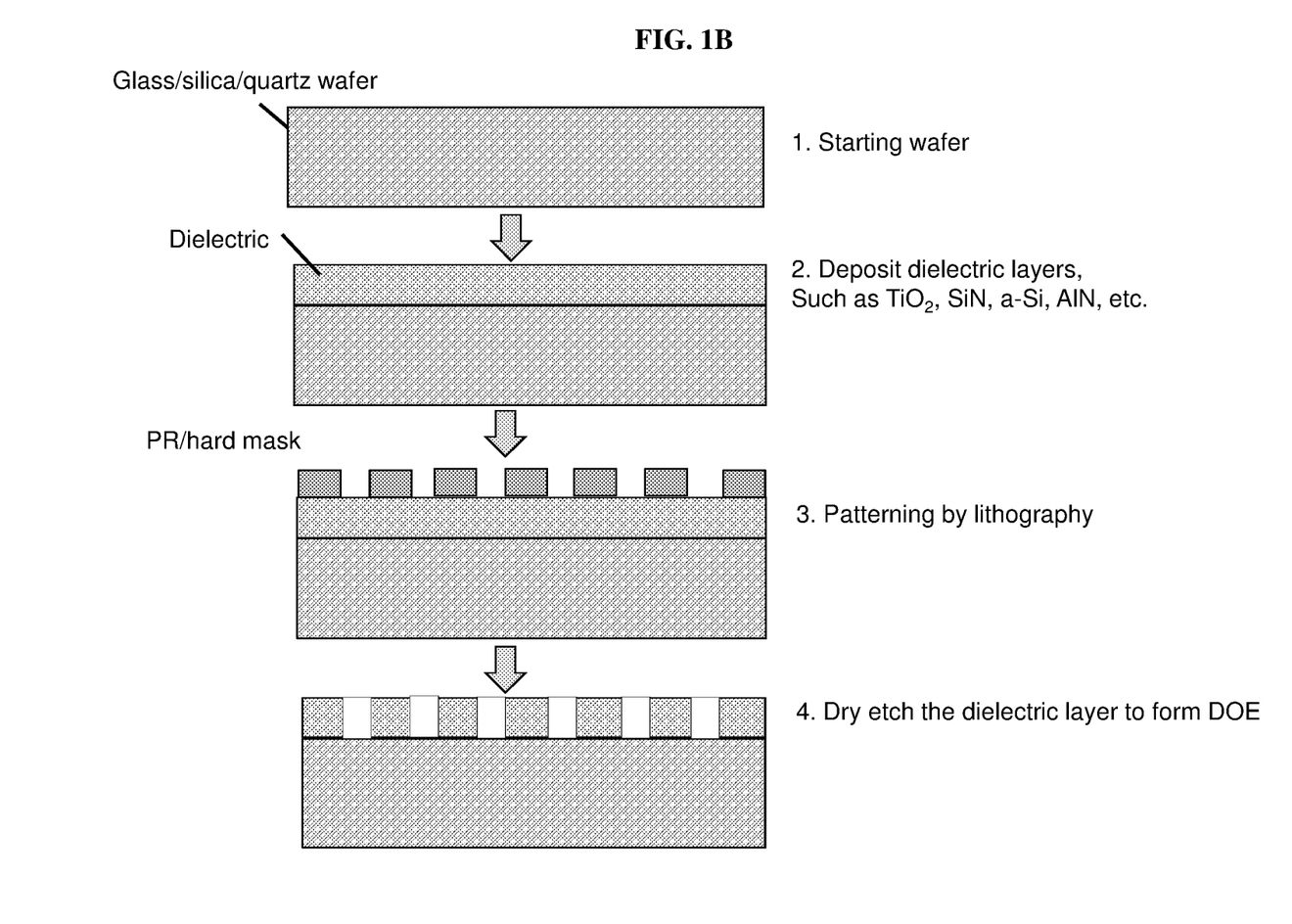
FIG. 1B shows a conventional process flow for fabricating visible wavelength metalenses on glass/silica/quartz substrates.

FIG. 1B shows a conventional process flow for fabricating visible wavelength metalenses on glass/silica/quartz substrates. For metalenses operating at visible wavelengths, glass/silica/quartz substrates may need to be used because of the transparency of glass/silica/quartz at these wavelengths. Silicon is opaque at these wavelengths. The fabrication may be straightforward.

The main issue may be incompatibility with standard semiconductor manufacturing technology. Manufacturing of visible wavelength metalenses using semiconductor equipment may be challenging because most of the processing and metrology tools, such as chemical vapour deposition (CVD), physical vapour deposition (PVD), lithography, dry etching, scanning electron microscopy (SEM) etc. are designed for silicon wafers. The tools may need to be modified and new processing recipes may need to be developed in order to run the glass/quartz wafers in these tools. These may lead to an increase in cost and developing time.

SUMMARY

Various embodiments may provide a method of fabricating a meta-lens structure. The method may include forming a first dielectric layer in contact with a silicon wafer. The method may also include forming a second dielectric layer in contact with the first dielectric layer. A refractive index of the second dielectric layer may be different from a refractive index of the first dielectric layer. The method may further include, in patterning the second dielectric layer. The method may additionally include removing at least a portion of the silicon wafer to expose the first dielectric layer.

Various embodiments may provide a meta-lens structure formed by any one method as described herein.

BRIEF DESCRIPTION OF THE DRAWINGS

The invention will be better understood with reference to the detailed description when considered in conjunction with the non-limiting examples and the accompanying drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or meta-lens structures is analogously valid for the other methods or meta-lens structures. Similarly, embodiments described in the context of a method are analogously valid for a meta-lens structure, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may seek to address or mitigate the issues described above.

Various embodiments may relate to methods of fabricating visible wavelengths metalenses on silicon wafers using standard semiconductor manufacturing technology without any modification. Various embodiments may be used to fabricate vertically stacked metalenses for multiple functions.

Figure 2:
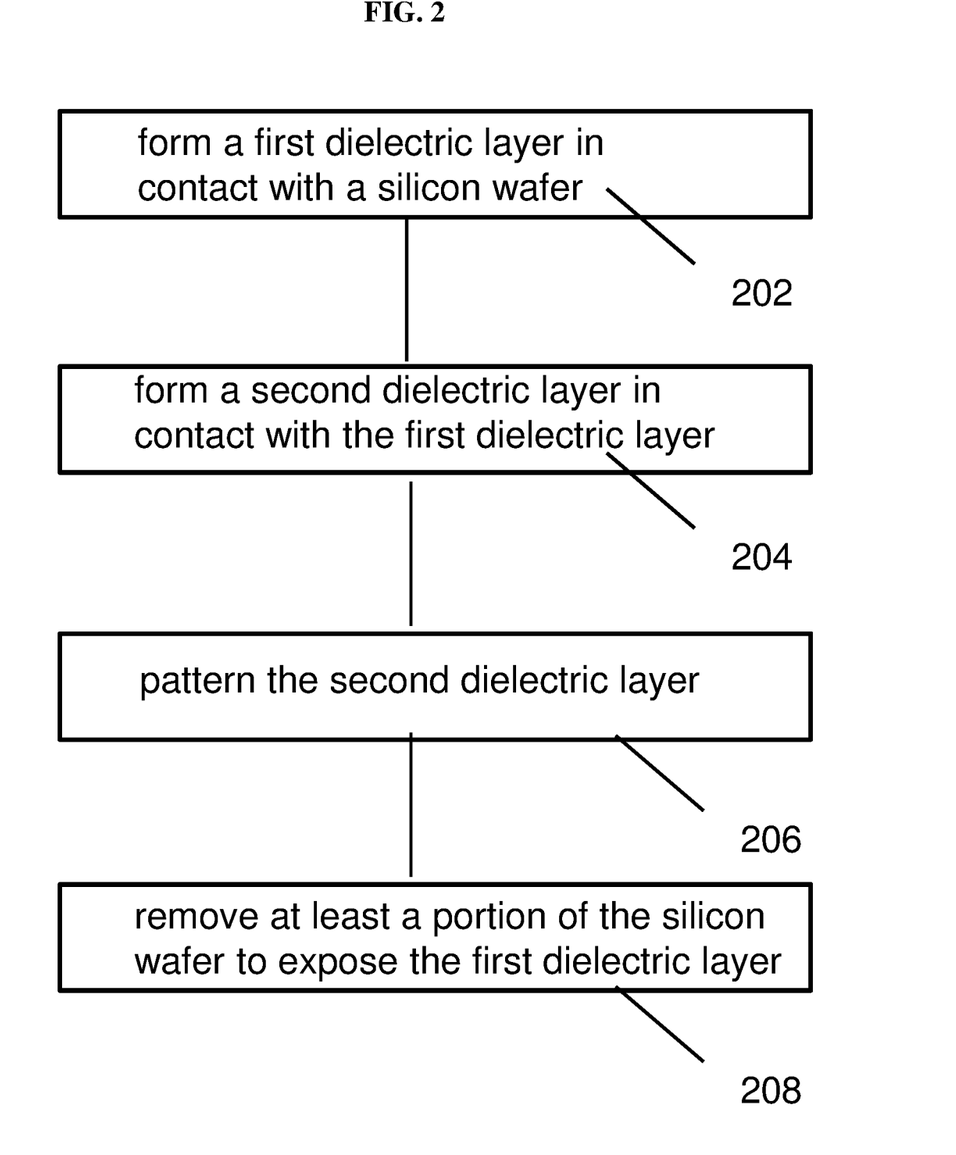
FIG. 2 is a general illustration of a method of fabricating a meta-lens structure according to various embodiments.

FIG. 2 is a general illustration of a method of fabricating a meta-lens structure according to various embodiments. The method may include, in 202, forming a first dielectric layer in contact with a silicon wafer. The method may also include, in 204, forming a second dielectric layer in contact with the first dielectric layer. A refractive index of the second dielectric layer may be different from a refractive index of the first dielectric layer. The method may further include, in 206, patterning the second dielectric layer. The method may additionally include, in 208, removing at least a portion of the silicon wafer to expose the first dielectric layer.

In other words, the method may include forming a first dielectric layer on the silicon wafer, and a second dielectric layer on the first dielectric layer, in which the second dielectric layer has a refractive index that is different from the refractive index of the first dielectric layer. The second dielectric layer may be patterned. A portion or the entire silicon wafer may then be removed to expose the first dielectric layer.

In various embodiments, the refractive index of the second dielectric layer may be greater than the refractive index of the first dielectric layer.

In various embodiments, the first dielectric layer may include one or more first sub-layers of a first material and one or more second sublayers of a second material.

A first sub-layer of the one or more first sub-layers may have a first surface in contact with a second sub-layer of the one or more second sub-layers, and a second surface opposite the first in contact with another second sub-layer of the one or more second sub-layers.

For instance, the first material may be silicon oxide ($SiO_2$), and the second material may be silicon nitride (SiN).

In various other embodiments, the first dielectric layer may include any one material selected from a group consisting of silicon oxide ($SiO_2$), silicon nitride (SiN), and aluminum nitride (AlN).

The first dielectric layer or multilayer may have a thickness in the ranges of μm to tens of μm.

The first dielectric layer may have a thickness selected from a range from 0.2 μm to 10 μm.

In various embodiments, the second dielectric layer may include any one material selected from a group consisting of titanium oxide, amorphous silicon, silicon nitride, and aluminum nitride.

In various embodiments, patterning the second dielectric layer may include forming or providing a mask over the second dielectric layer, and removing the exposed portions of the second dielectric layer via etching. For instance, in various embodiments, the mask may include photoresist. A layer of photoresist may be deposited over the second dielectric layer. The photoresist may be patterned by lithography or photolithography. Portions of the photoresist may then be removed, thereby forming the mask over the second dielectric layer. In various other embodiments, the mask may be a hard mask.

The silicon wafer may be patterned on the backside. In various embodiments, the method may also include forming a patterned layer on a surface of the silicon wafer opposite another surface of the silicon wafer the first dielectric layer is in contact with. The method may further include removing the portion of the silicon wafer exposed through the patterned layer while a further portion of the silicon wafer covered by the patterned layer remains in contact with the first dielectric layer. The portion of the silicon wafer may be removed via etching e.g. dry etching. Removing the portion of the silicon wafer may expose a portion of the first dielectric layer.

In various other embodiments, the silicon wafer may be entirely removed. The method may further include forming a layer of silicon oxide in contact with the second dielectric layer after the second dielectric layer is patterned and before the silicon wafer is entirely removed.

The method may also include bonding a wafer (alternatively referred to as a carrier wafer) to the silicon oxide layer after the silicon oxide layer is formed, and before the silicon wafer is entirely removed. The wafer or carrier wafer may include glass, silica, or quartz. The wafer or carrier wafer may be a glass, silica or quartz wafer. Bonding the wafer or carrier wafer to the silicon oxide layer may include anodic bonding or fusion bonding.

The silicon wafer may be removed after the wafer or carrier wafer is bonded to the silicon oxide layer. The method may also include removing a portion of the first dielectric layer to planarize a surface of the first dielectric layer via chemical mechanical polishing (CMP) to form a meta-lens layer. The meta-lens layer may include one or more diffractive optical elements (DOE). The DOE may be defined by the patterned second dielectric layer.

In various embodiments, the method may include forming one or more further meta-lens layers over the meta-lens layer.

In various embodiments, the meta-lens layer may be in contact with a first surface of the wafer. The method may also include forming a further meta-lens layer in contact with a second surface of the wafer opposite the first surface.

Various embodiments may relate to a meta-lens structure formed by any one method as described herein. Various embodiments may relate to a meta-lens structure.

In various embodiments, the meta-lens structure may include a first dielectric layer. The meta-lens structure may include a patterned second dielectric layer in contact with the first dielectric layer. The meta-lens structures may also include a silicon wafer in contact with the first dielectric layer, the silicon wafer having at least a portion removed. The silicon wafer may be in contact with a first surface of the first dielectric layer, while the (patterned) second dielectric layer may be in contact with a second surface of the first dielectric layer opposite the first. A refractive index of the (patterned) second dielectric layer may be different from a refractive index of the first dielectric layer.

In various other embodiments, the meta-lens structure may include a wafer or carrier wafer, such as a glass, silica or quartz wafer. The meta-lens structure may also include a silicon oxide layer in contact with the wafer or carrier wafer. The meta-lens structure may further include a first dielectric layer, and a patterned second dielectric layer. The (patterned) second dielectric layer may have a first surface in contact with the silicon oxide layer, and a second surface opposite the first surface in contact with the first dielectric layer.

The silicon oxide layer, the first dielectric layer, and the (patterned) second dielectric layer may form a meta-lens or DOE layer. Various embodiments may include a meta-lens structure including one or more further meta-lens or DOE layers above the meta-lens or DOE layer forming a vertical stack. Each of the one or more further meta-lens or DOE layer may include a respective silicon oxide layer, a respective first dielectric layer, and a respective (patterned) second dielectric layer.

In various embodiments, the meta-lens or DOE layer may be in contact with a first surface of the wafer or carrier wafer. The meta-lens structure may also include a further meta-lens or DOE layer in contact with a second surface of the wafer or carrier wafer opposite the first surface. The one or more further meta-lens or DOE layer may include a further silicon oxide layer, a further first dielectric layer, and a further (patterned) second dielectric layer.

Figure 3:
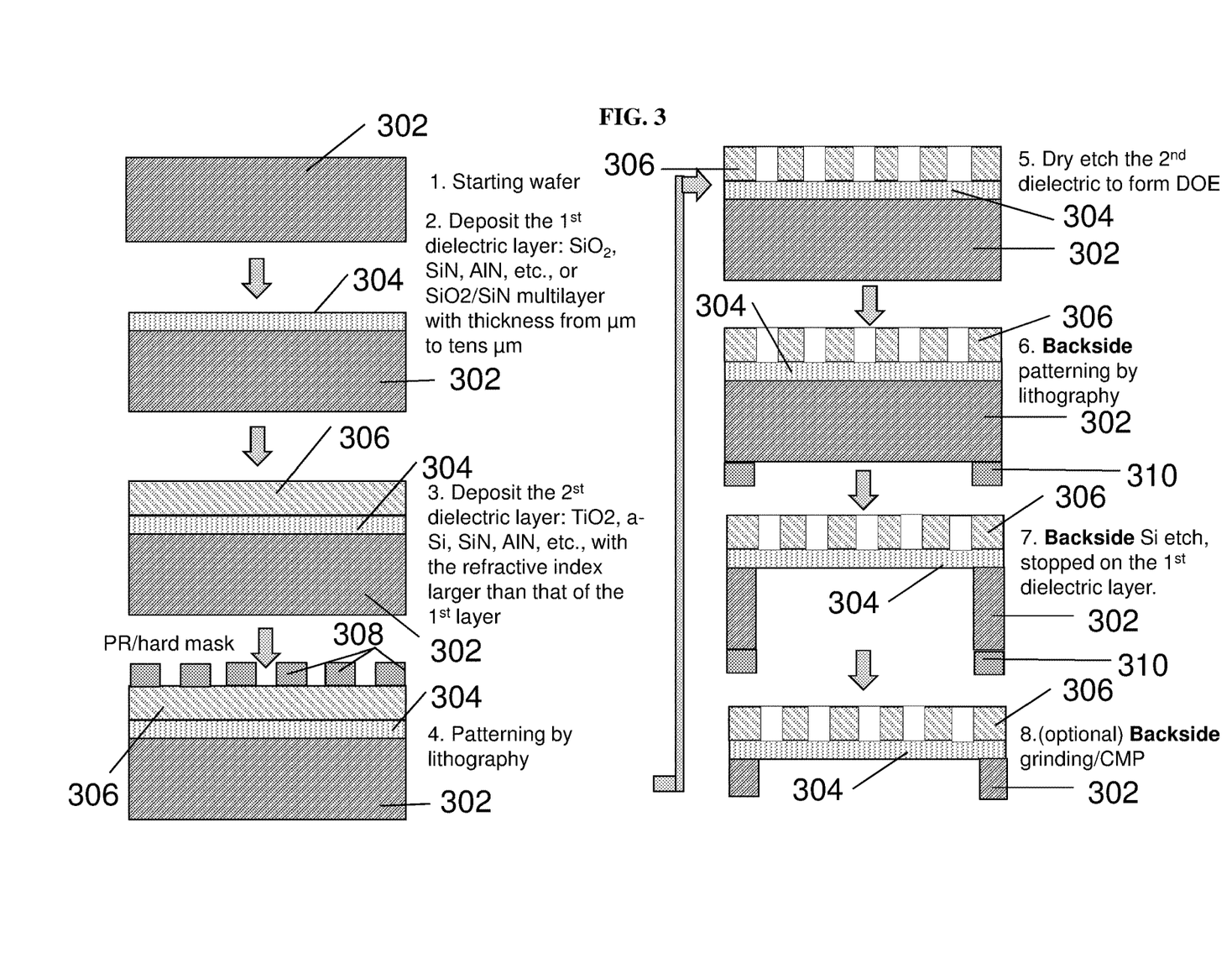
FIG. 3 is a schematic showing a method of fabricating a meta-lens structure according to various embodiments.

FIG. 3 is a schematic showing a method of fabricating a meta-lens structure according to various embodiments. In Step 1, a silicon wafer 302 may be provided. In Step 2, a first dielectric layer 304 (dielectric-1) may be formed in contact with the silicon wafer 302. In Step 3, a second dielectric layer 306 (dielectric-2) may be formed in contact with the first dielectric layer 304. The first dielectric layer 304 and the second dielectric layer 306 may be formed via chemical vapour deposition (CVD) and/or physical vapour deposition (PVD). A refractive index of the second dielectric layer 306 may be greater than a refractive index of the first dielectric layer 304.

In various embodiments, the first dielectric layer 304 may include silicon oxide ($SiO_2$), silicon nitride (SiN), and/or aluminum oxide ($Al_2O_3$). In various other embodiments, the first dielectric layer 304 may be a multilayer, e.g. a $SiO_2$/SiN multilayer. In other words, the first dielectric layer 304 may include one or more first sub-layers of a first material (e.g. silicon oxide) and one or more second sub-layers of a second material (e.g. silicon nitride). The first dielectric layer 304 may include alternating first sub-layers and second sub-layers.

In various embodiments, the second dielectric layer 306 may include titanium oxide ($TiO_2$), amorphous silicon (a-Si), silicon nitride (SiN), and/or aluminum nitride (AlN).

Step 4 shows forming or providing a mask 308 over the second dielectric layer 306. The mask 308 may be a hard mask or may be a photoresist mask formed by photolithography. The mask may cover portions of the second dielectric layer 306, while exposing other portions of the second dielectric layer 306. Step 5 shows patterning the second dielectric layer 306. The other portions of the second dielectric layer 306 exposed by the mask may be etched, e.g. via dry etching. As such, the second dielectric layer 306 may be patterned using standard photolithography and dry etch processes.

Step 6 shows forming a patterned layer 310 on a surface of the silicon wafer 302 opposite another surface of the silicon wafer 302 the first dielectric layer 304 is in contact with. The patterned layer 310 may be formed by depositing photoresist, and patterning the deposited photoresist using photolithography. Step 7 shows removing the portion of the silicon wafer 302 exposed through the patterned layer 310 (e.g. via etching) while a further portion of the silicon wafer covered by the patterned layer 310 remains in contact with the first dielectric layer 304 (i.e. is not removed). The portion of the silicon wafer 302 may be removed such that a portion of the first dielectric layer 304 is exposed. In other words, the backside of the silicon wafer 302 may be patterned and silicon (not covered by the patterned layer 310) may be etched until stopped by the first dielectric layer 304.

Step 8 shows removing the patterned layer 310 and a further portion of the silicon wafer 302 via processes such as grinding and/or chemical mechanical polishing (CMP). The silicon wafer 302 may be grinded/CMP down to a certain thickness. Step 8 may be optional. Since the first dielectric layer 304 is configured to allow visible light to pass through (i.e. transparent at visible wavelengths), the fabricated meta-lens structure or device may operate at visible wavelengths.

Since the lens is sustained by the first dielectric layer 304, it may be required to be thick enough to provide sufficient mechanical strength. However, a thick dielectric layer may have large stress, resulting in wafer warpage. This issue may be overcome by using $SiO_2$/SiN multilayer. Since $SiO_2$ and SiN have opposite stresses, a $SiO_2$/SiN multilayer may have a small resultant stress, which causes less wafer warpage. Moreover, the alternating $SiO_2$/SiN multilayer may form an anti-reflection layer to increase transmission of the lenses.

Figure 4:
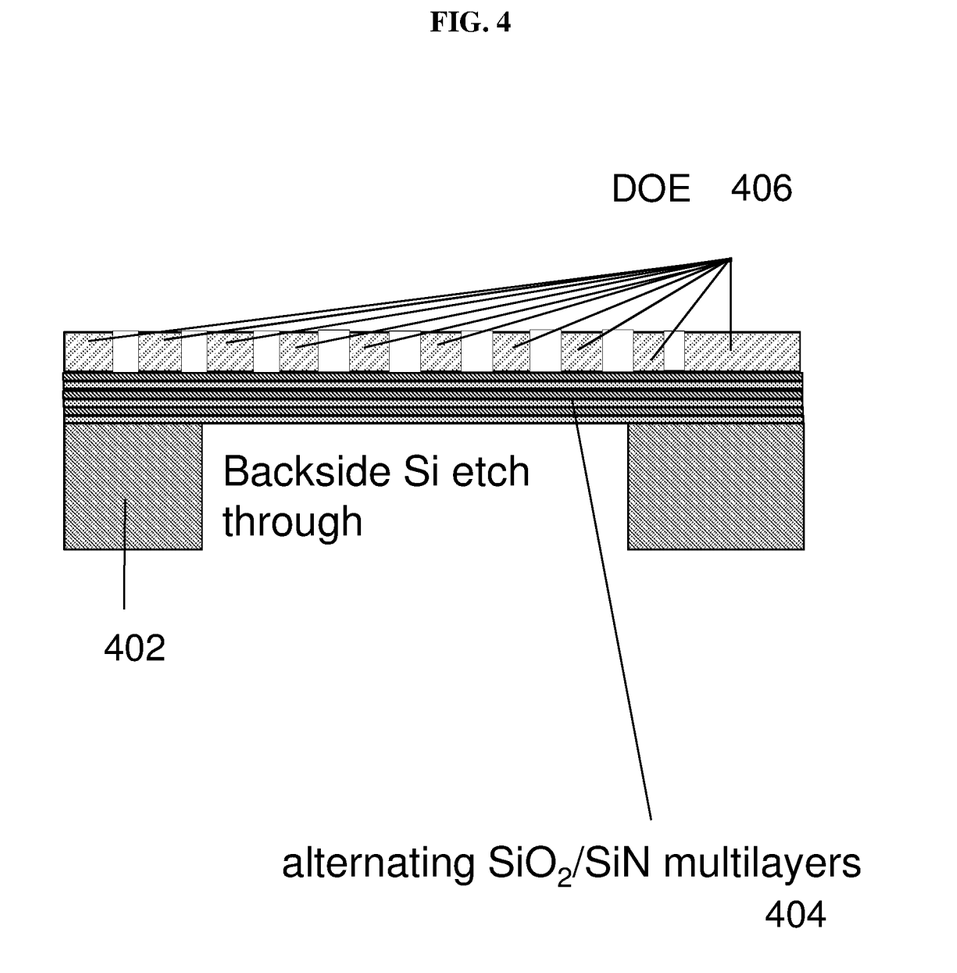
FIG. 4 shows a meta-lens structure according to various embodiments.

FIG. 4 shows a meta-lens structure according to various embodiments. The meta-lens structure may include a patterned second dielectric layer 406 in contact with the first dielectric layer 404. The first dielectric layer 404 may include alternating silicon oxide ($SiO_2$) and silicon nitride (SiN) sub-layers. With appropriate thicknesses, the alternating silicon oxide ($SiO_2$) and silicon nitride (SiN) sub-layers may reduce stress and may also reduce reflection.

The meta-lens structures may also include a silicon wafer 402 in contact with the first dielectric layer, the silicon wafer 402 having at least a portion removed. The silicon wafer 402 may include a through-hole extending from one surface of the silicon wafer 402 to an opposing surface of the silicon wafer 402. The silicon wafer 402 may be in contact with a first surface of the first dielectric layer 404, while the (patterned) second dielectric layer 406 may be in contact with a second surface of the first dielectric layer 404 opposite the first. A refractive index of the (patterned) second dielectric layer 406 may be different from a refractive index of the first dielectric layer 404.

Figure 5:
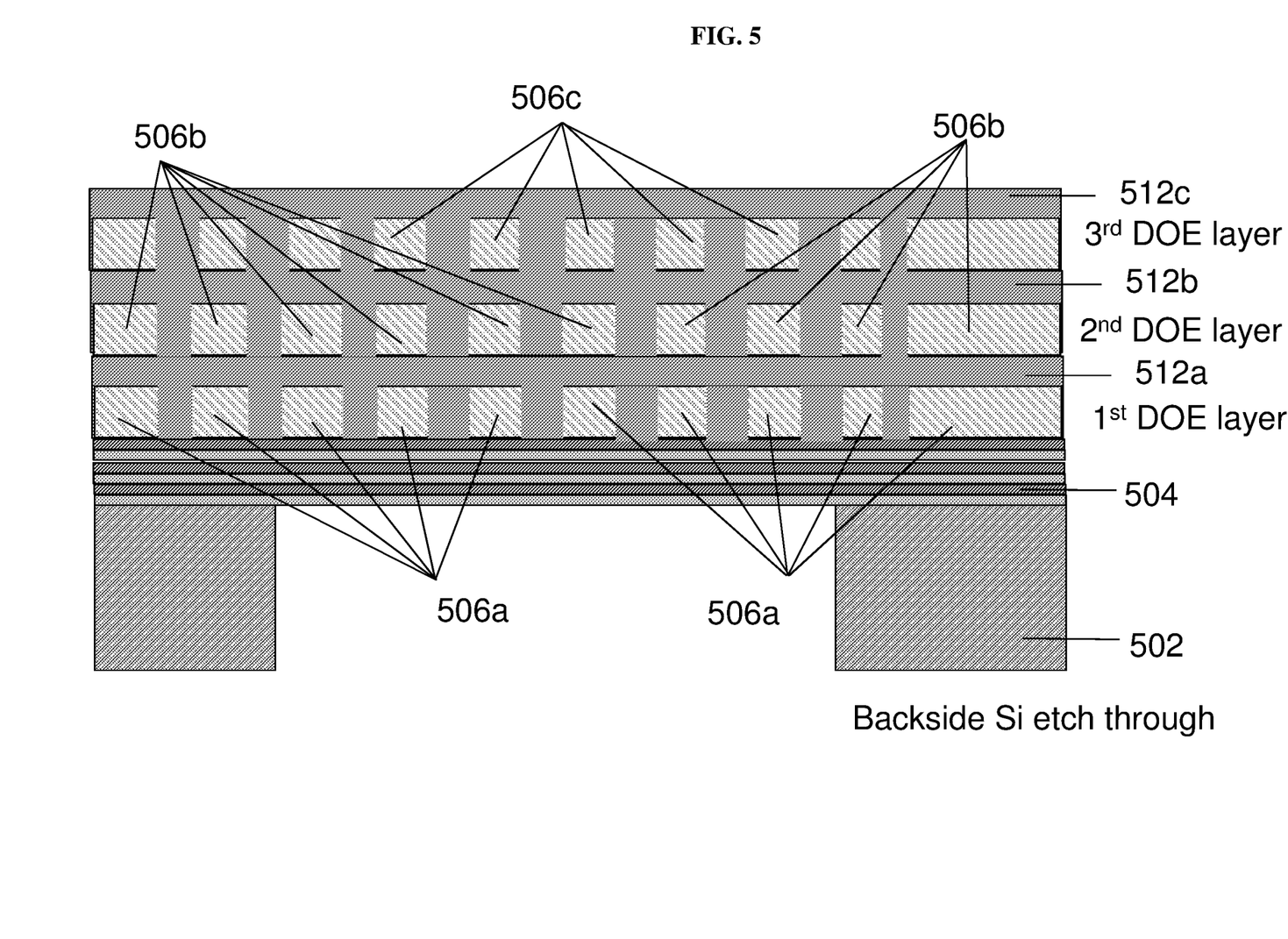
FIG. 5 shows a meta-lens structure according to various embodiments.

FIG. 5 shows a meta-lens structure according to various embodiments. The meta-lens structure may include a first dielectric layer 504, which may include alternating sub-layers of different materials. The meta-lens structures may also include a silicon wafer 502 in contact with the first dielectric layer 504, the silicon wafer 502 having at least a portion removed (backside Si etch through). The silicon wafer 502 may include a through-hole extending from one surface of the silicon wafer 502 to an opposing surface of the silicon wafer 502. The meta-lens structure may further include a first meta-lens or DOE layer including a patterned second dielectric layer 506a, as well as a silicon oxide layer 512a in contact with the patterned second dielectric layer 506a. As shown in FIG. 5, portions of the silicon oxide layer 512a may be in contact with the first dielectric layer 504. The patterned second dielectric layer 506a may be in contact with the first dielectric layer 504.

The meta-lens structure may additionally include a second meta-lens or DOE layer in contact with the first meta-lens or DOE layer. The second meta-lens or DOE layer may include a further patterned second dielectric layer 506b, as well as a further silicon oxide layer 512b in contact with the further patterned second dielectric layer 506b. The further patterned second dielectric layer 506b may be in contact with the silicon oxide layer 512a, and portions of the further silicon oxide layer 512b may also be in contact with the silicon oxide layer 512a.

The meta-lens structure may additionally include a third meta-lens or DOE layer in contact with the second meta-lens or DOE layer. The third meta-lens or DOE layer may include another patterned second dielectric layer 506c, as well as another silicon oxide layer 512c in contact with the other patterned second dielectric layer 506c. The other patterned second dielectric layer 506c may be in contact with the further silicon oxide layer 512b, and portions of the other silicon oxide layer 512c may also be in contact with the further silicon oxide layer 512b.

In order to fabricate the meta-lens structure as shown in FIG. 5, the method shown in steps 1-5 of FIG. 3 may be followed (with the first dielectric layer being a multilayer) to form an initial structure. Thereafter, silicon oxide may be deposited, followed by CMP of the deposited silicon oxide to form the silicon oxide layer 512a. The silicon oxide may be deposited on the patterned second dielectric layer 506a, with portions of the silicon oxide in contact with the first dielectric layer 504.

Steps 3-5 may be repeated to form the second DOE layer. In other words, a further second dielectric layer may be formed in contact with the silicon oxide layer 512a, and the further second dielectric layer may be patterned to form the further patterned second dielectric layer 506b. Additionally, silicon oxide may be deposited, followed by CMP of the deposited silicon oxide to form the further silicon oxide layer 512b. The silicon oxide may be deposited on the further patterned second dielectric layer 506b, with portions of the silicon oxide in contact with the first silicon oxide layer 512a.

Steps 3-5 may be repeated to form the third DOE layer. In other words, another second dielectric layer may be formed in contact with the further silicon oxide layer 512b, and the other second dielectric layer may be patterned to form the other patterned second dielectric layer 506c. Additionally, silicon oxide may be deposited, followed by CMP of the deposited silicon oxide to form the other silicon oxide layer 512c. The silicon oxide may be deposited on the other patterned second dielectric layer 506c, with portions of the silicon oxide in contact with the second silicon oxide layer 512b.

In various embodiments, subsequent DOE layers may also be formed by repeating steps 3-5 and forming subsequent silicon oxide layers.

Upon forming the multiple DOE layers, steps 6-8 may be carried out to open the window at the backside by etching through silicon.

Figure 6A:
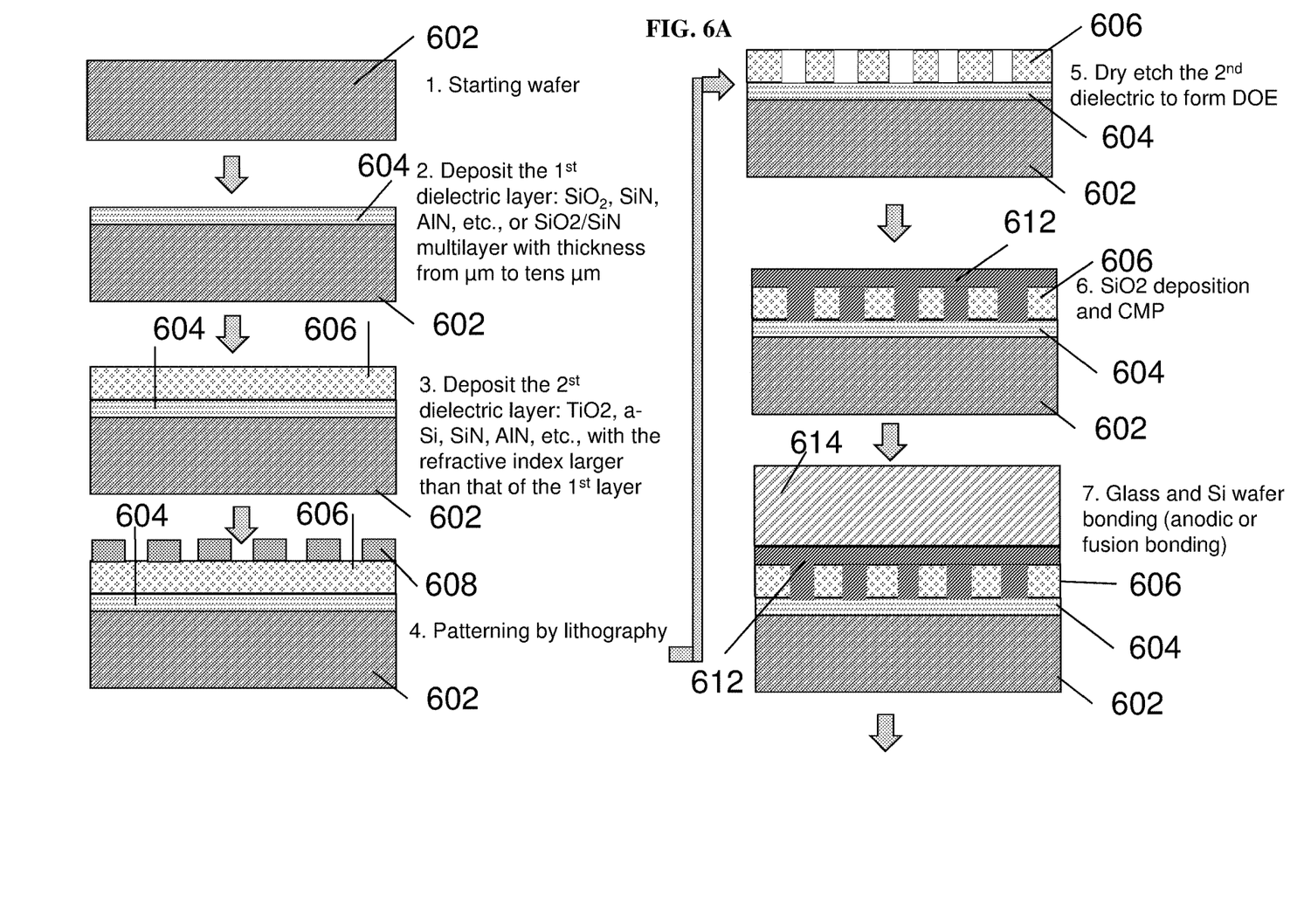
FIG. 6A is a schematic showing the first part of a method of fabricating a meta-lens structure according to various embodiments.
Figure 6B:
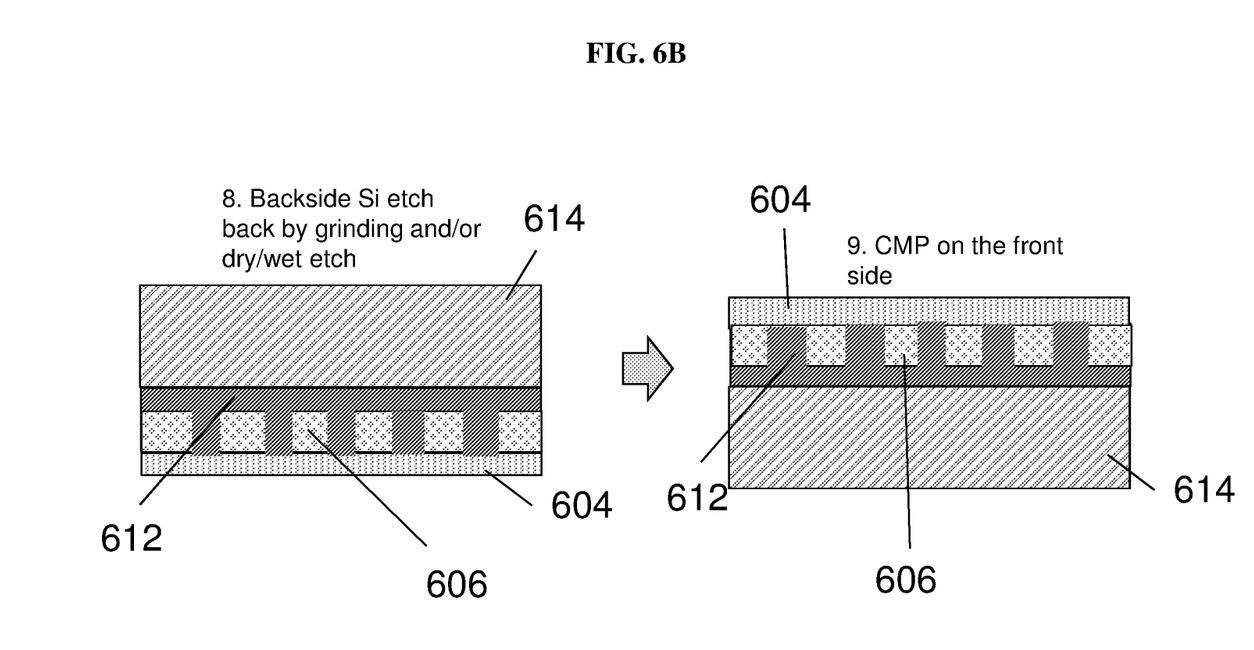
FIG. 6B is a schematic showing the second part of the method of fabricating the meta-lens structures according to various embodiments.

FIG. 6A is a schematic showing the first part of a method of fabricating a meta-lens structure according to various embodiments. FIG. 6B is a schematic showing the second part of the method of fabricating the meta-lens structures according to various embodiments. In Step 1, a silicon wafer 602 may be provided. In Step 2, a first dielectric layer 604 (dielectric-1) may be formed in contact with the silicon wafer 602. In Step 3, a second dielectric layer 606 (dielectric-2) may be formed in contact with the first dielectric layer 604. The first dielectric layer 604 and the second dielectric layer 606 may be formed via chemical vapour deposition (CVD) and/or physical vapour deposition (PVD). A refractive index of the second dielectric layer 606 may be greater than a refractive index of the first dielectric layer 604.

In various embodiments, the first dielectric layer 604 may include silicon oxide ($SiO_2$), silicon nitride (SiN), and/or aluminum oxide ($Al_2O_3$). In various other embodiments, the first dielectric layer 604 may be a multilayer, e.g. a $SiO_2$/SiN multilayer. In other words, the first dielectric layer 604 may include one or more first sub-layers of a first material (e.g. silicon oxide) and one or more second sub-layers of a second material (e.g. silicon nitride). The first dielectric layer 604 may include alternating first sub-layers and second sub-layers.

In various embodiments, the second dielectric layer 606 may include titanium oxide ($TiO_2$), amorphous silicon (a-Si), silicon nitride (SiN), and/or aluminum nitride (AlN).

Step 4 shows forming or providing a mask 608 over the second dielectric layer 606. The mask 608 may be a hard mask or may be a photoresist mask formed by photolithography. The mask may cover portions of the second dielectric layer 606, while exposing other portions of the second dielectric layer 606. Step 5 shows patterning the second dielectric layer 606. The other portions of the second dielectric layer 606 exposed by the mask may be etched, e.g. via dry etching. As such, the second dielectric layer 606 may be patterned using standard photolithography and dry etch processes.

Step 6 shows forming a layer of silicon oxide 612 in contact with the second dielectric layer 606 after the second dielectric layer 606 is patterned. Silicon oxide may be deposited, followed by chemical mechanical polishing (CMP) to form the layer of silicon oxide 612. Step 7 shows bonding a wafer 614 to the silicon oxide layer 614 after the silicon oxide layer 614 is formed. The wafer 614 may be a glass, silica or a quartz wafer. The wafer 614 may be referred to as a carrier wafer. The wafer 614 may be bonded to the silicon oxide layer 614 via anodic bonding or fusion bonding.

Step 8 shows removing the silicon wafer 602. The silicon wafer 602 may entirely be removed by grinding and/or dry/wet etch. The silicon wafer 602 may first be backside grinded from ~750 μm to ~1-2 μm. The remaining silicon (Si) may then be removed by wet etch or dry etch. Step 9 shows chemical mechanical polishing (CMP) on the front side. A portion of the wafer 614 may be removed.

Figure 7:
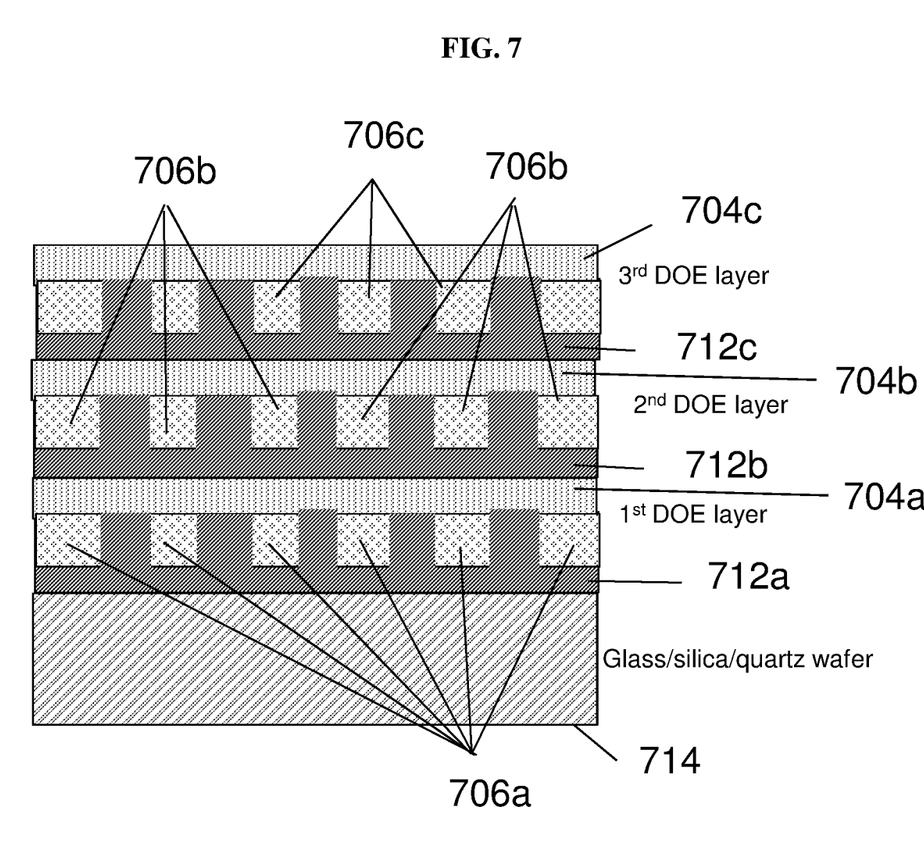
FIG. 7 shows a meta-lens structure according to various embodiments.

FIG. 7 shows a meta-lens structure according to various embodiments. The meta-lens structure may include a wafer or carrier wafer 714, such as a glass, silica or quartz wafer. The meta-lens structure may also include a silicon oxide layer 712a in contact with the wafer or carrier wafer 714. The meta-lens structure may further include a first dielectric layer 704a, and a patterned second dielectric layer 706a. The (patterned) second dielectric layer 706a may have a first surface in contact with the silicon oxide layer 704a, and a second surface opposite the first surface in contact with the first dielectric layer 704a. The first dielectric layer 704a may be in contact with the silicon oxide layer 712a and the (patterned) second dielectric layer 706a.

The silicon oxide layer 712a, the first dielectric layer 704a, and the (patterned) second dielectric layer 706a may form a meta-lens or DOE layer. Various embodiments may include a meta-lens structure including one or more further meta-lens or DOE layers above the meta-lens or DOE layer forming a vertical stack. Each of the one or more further meta-lens or DOE layer may include a respective silicon oxide layer, a respective first dielectric layer, and a respective (patterned) second dielectric layer.

As shown in FIG. 7, the meta-lens structure may further include a further silicon oxide layer 712b in contact with the first dielectric layer 704a, and a further (patterned) second dielectric layer 706b in contact with the further silicon oxide layer 712b. The meta-lens structure may also include a further first dielectric layer 704b in contact with the further silicon oxide layer 712b and the further (patterned) second dielectric layer 706b.

The meta-lens structure may further include another silicon oxide layer 712c in contact with the further first dielectric layer 704b, and another (patterned) second dielectric layer 706c in contact with the other silicon oxide layer 712c. The meta-lens structure may also include another first dielectric layer 704c in contact with the other silicon oxide layer 712c and the other (patterned) second dielectric layer 706c.

The meta-lens structure as shown in FIG. 7 may be formed by repeating similar steps shown in steps 1-9 of FIGS. 6A-B. An initial meta-lens structure may be formed according to steps 1-9 shown in FIGS. 6A-B. A further first dielectric layer may be formed (step 2) on a further silicon wafer (step 1). Thereafter, a further second dielectric layer may be formed in contact with the further first dielectric layer (step 3). The further second dielectric layer may be patterned similar to that shown in steps 4-5, and a further silicon oxide layer may be formed as shown in step 6. At step 7, the further silicon oxide layer may be bonded to the first dielectric layer of the initial meta-lens structure. The further silicon wafer may then be removed (step 8), and CMP may be carried out on the further first dielectric layer (step 9), thereby forming a meta-lens structure with two DOE layers. Meta-lens structures with three or more DOE layers may be formed by repeating steps 1-9.

Figure 8:
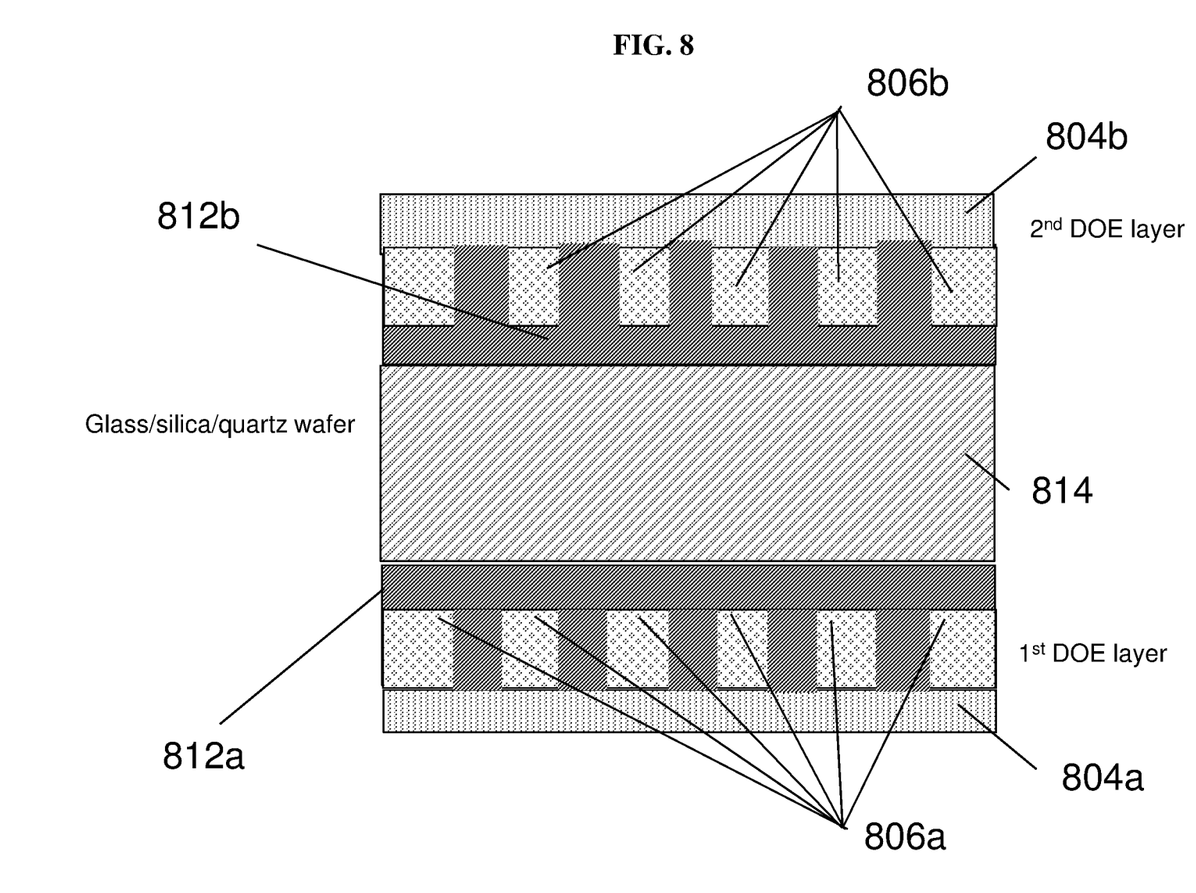
FIG. 8 shows a meta-lens structure according to various embodiments.

FIG. 8 shows a meta-lens structure according to various embodiments. The meta-lens structure may include a wafer or carrier wafer 814, such as a glass, silica or quartz wafer. The meta-lens structure may also include a silicon oxide layer 812a on a first surface of the wafer or carrier wafer 814 and a further silicon oxide layer 812b on a second surface of the wafer opposite the first surface. The meta-lens structure may also include a patterned second dielectric layer 806a in contact with the silicon oxide layer 812a, and a further patterned second dielectric layer 806b in contact with the further silicon oxide layer 812b. The meta-lens structure may additionally include a first dielectric layer 804a in contact with the patterned second dielectric layer 806a and the silicon oxide layer 812a, as well as a further first dielectric layer 804b in contact with the further patterned second dielectric layer 806b and the further silicon oxide layer 812b. The meta-lens structure may show unique function.

The meta-lens structure as shown in FIG. 8 may be formed by repeating similar steps shown in steps 1-9 of FIGS. 6A-B. An initial meta-lens structure may be formed according to steps 1-9 shown in FIGS. 6A-B, the initial meta-lens structure having one surface in contact with the silicon oxide layer 612, and another opposing surface exposed. A further first dielectric layer may be formed (step 2) on a further silicon wafer (step 1). Thereafter, a further second dielectric layer may be formed in contact with the further first dielectric layer (step 3). The further second dielectric layer may be patterned similar to that shown in steps 4-5, and a further silicon oxide layer may be formed as shown in step 6. At step 7, the exposed surface of the initial meta-lens surface may be bonded to the further silicon oxide layer. The further silicon wafer may then be removed (step 8) and CMP may be performed on the further first dielectric layer (step 9).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method of fabricating a meta-lens structure, the method comprising:
   forming a first dielectric layer in contact with a silicon wafer;
   forming a second dielectric layer in contact with the first dielectric layer, a refractive index of the second dielectric layer different from a refractive index of the first dielectric layer;
   patterning the second dielectric layer; and
   removing at least a portion of the silicon wafer to expose the first dielectric layer,
   wherein the silicon wafer is entirely removed;
   wherein the method further comprises forming a layer of silicon oxide in contact with the second dielectric layer after the second dielectric layer is patterned and before the silicon wafer is entirely removed; and
   wherein the method also comprises bonding a wafer to the silicon oxide layer after the silicon oxide layer is formed, and before the silicon wafer is entirely removed.

2. The method according to claim 1, wherein the refractive index of the second dielectric layer is greater than the refractive index of the first dielectric layer.

3. The method according to claim 1, wherein the first dielectric layer includes one or more first sub-layers of a first material and one or more second sublayers of a second material.

4. The method according to claim 3, wherein a first sub-layer of the one or more first sub-layers has a first surface in contact with a second sub-layer of the one or more second sub-layers, and a second surface opposite the first in contact with another second sub-layer of the one or more second sub-layers.

5. The method according to claim 3, wherein the first material is silicon oxide, and the second material is silicon nitride.

6. The method according to claim 1, wherein the first dielectric layer comprises any one material selected from a group consisting of silicon oxide, silicon nitride, and aluminum nitride.

7. The method according to claim 1, wherein the second dielectric layer comprises any one material selected from a group consisting of titanium oxide, amorphous silicon, silicon nitride, and aluminum nitride.

8. The method according to claim 1, wherein patterning the second dielectric layer comprises forming or providing a mask over the second dielectric layer, and removing the exposed portions of the second dielectric layer via etching.

9. The method according to claim 1, further comprising:
   forming a patterned layer on a surface of the silicon wafer opposite another surface of the silicon wafer the first dielectric layer is in contact with; and
   removing the portion of the silicon wafer exposed through the patterned layer while a further portion of the silicon wafer covered by the patterned layer remains in contact with the first dielectric layer.

10. The method according to claim 9, wherein removing the portion of the silicon wafer exposes a portion of the first dielectric layer.

11. The method according to claim 9, wherein the portion of the silicon wafer is removed via etching.

12. The method according to claim 1, wherein the layer of silicon oxide is also in contact with exposed portions of the first dielectric layer.

13. The method according to claim 1, wherein the wafer is configured to allow visible light to pass through.

14. The method according to claim 1, wherein the wafer comprises glass, silica, or quartz.

15. The method according to claim 1, wherein bonding the wafer to the silicon oxide layer comprises anodic bonding or fusion bonding.

16. The method according to claim 1, further comprising:
   removing a portion of the first dielectric layer to planarize a surface of the first dielectric layer via chemical mechanical polishing to form a meta-lens layer.

17. The method according to claim 16, further comprising:
   forming one or more further meta-lens layers over the meta-lens layer.

18. The method according to claim 16,
   wherein the meta-lens layer is in contact with a first surface of the wafer; and
   wherein the method also comprises forming a further meta-lens layer in contact with a second surface of the wafer opposite the first surface.

* * * * *